(12) United States Patent
Ohno et al.

(10) Patent No.: US 6,916,726 B2
(45) Date of Patent: Jul. 12, 2005

(54) METHOD FOR FORMING SCRIBED GROOVE AND SCRIBING APPARATUS

(75) Inventors: Yuji Ohno, Osaka (JP); Hiroshi Imai, Osaka (JP); Yoshito Nakase, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 36 days.

(21) Appl. No.: 10/624,985

(22) Filed: Jul. 22, 2003

(65) Prior Publication Data

US 2004/0126995 A1 Jul. 1, 2004

(30) Foreign Application Priority Data

Jul. 22, 2002 (JP) ........................................ 2002-212240

(51) Int. Cl.[7] ........................ H01L 21/301; H01L 21/46; H01L 21/78; H01L 21/76
(52) U.S. Cl. ........................ 438/460; 438/462; 438/401
(58) Field of Search .............................. 438/462, 460, 438/401

(56) References Cited

U.S. PATENT DOCUMENTS 6,515,309 B1 * 2/2003 Tohyama et al. ............. 257/88

FOREIGN PATENT DOCUMENTS

| JP | 60-72211 | 5/1985 |
|----|----------|--------|
| JP | 62-65209 | 4/1987 |
| JP | 62-163386 | 7/1987 |
| JP | 08316570 A | 11/1996 |
| JP | 11-010481 | 1/1999 |
| JP | 2001-345290 | 12/2001 |

* cited by examiner

*Primary Examiner*—Craig A. Thompson
(74) *Attorney, Agent, or Firm*—Fish & Richardson P.C.

(57) ABSTRACT

A method for forming scribed grooves on a wafer and an apparatus for implementing the method. The method moves the cutting part such that its cutting edge forms an inverted trapezoid-shaped path, thereby reducing the scribing angle of the cutting edge to an acute angle. Consequently, the stress produced by the mechanical shock at the time of the scribing can be dispersed in the moving direction of the cutting edge and in a direction perpendicular to the surface of the wafer. The horizontal movement of the scribing cutting edge in the wafer enables the application of a sufficient load in a direction perpendicular to the scribing plane in the wafer. Consequently, vertical cracks are sufficiently generated, and the amount of dimensional deviation between the scribed groove and the cleaved plane is reduced. This method can produce chips featuring outside dimensions with higher precision and cleaved surfaces with high-quality mirror finish.

4 Claims, 15 Drawing Sheets

FIG. 12 (A) Prior Art
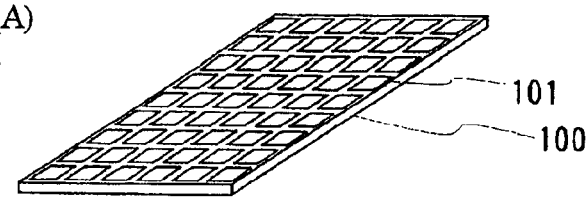
FIG. 12 (B) Prior Art
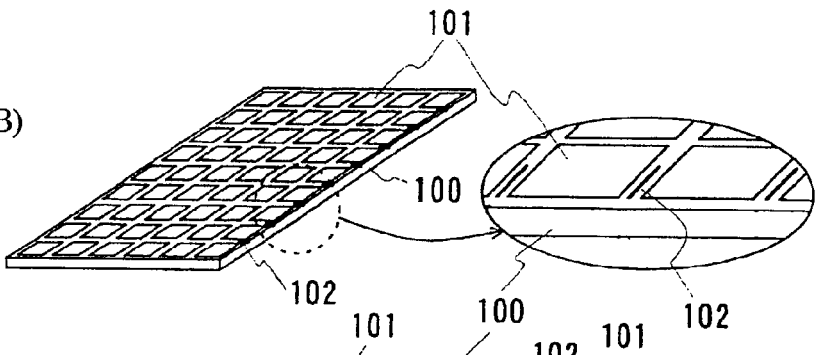
FIG. 12 (C) Prior Art
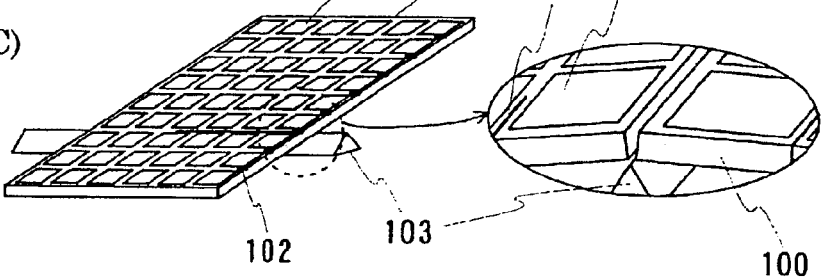
FIG. 12 (D) Prior Art
FIG. 12 (E) Prior Art
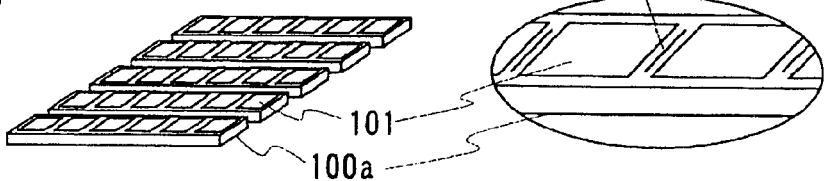
FIG. 12 (F) Prior Art
FIG. 12 (G) Prior Art
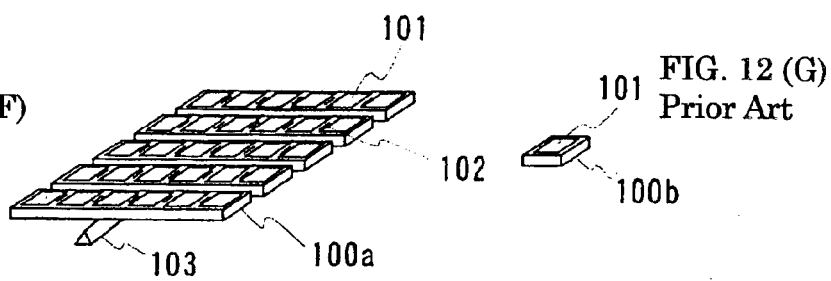

Mounting position of
the optical fiber

Mounting position of the chip

METHOD FOR FORMING SCRIBED GROOVE AND SCRIBING APPARATUS

BACKGROUND OF THE INVENTION

1. Field of the Invention

The present invention relates to a method for forming a scribed groove at the surface portion of a wafer so that the groove can act as the starting point for splitting the wafer to obtain chips by exploiting the cleaving property of the wafer and a scribing apparatus for implementing the method. The present invention particularly relates to a method for forming a scribed groove that can considerably reduce the amount of dimensional deviation between the scribed groove and the cleaved plane and a scribing apparatus for implementing the method.

2. Description of the Background Art

Semiconductor chips are produced by separating them from a wafer such as a laser diode wafer. In this case, scribed grooves are first formed at the surface portion of the wafer with a scribing apparatus. Then, a cleaving prism performs the cleaving work by concentrating the stress on the scribed groove. This is a well known technique. FIGS. 12(A) to 12(G) are schematic diagrams illustrating the process for producing chips from a wafer. First, electrode patterns 101 are formed on the surface of a wafer 100 (see FIG. 12(A)). Then, a scribing apparatus (not shown in the figure) forms scribed grooves 102 between the electrode patterns 101 from the edge of the wafer 100 (see FIG. 12(B)). A cleaving prism 103 having the shape of a triangular prism is pressed against the back face of the wafer 100 (the face where no electrode patterns are formed) along the scribed groove 102 (see FIG. 12(C)). The pressing operation cleaves the wafer 100 to obtain a number of bars, with the scribed groove 102 acting as the starting point of the cleavage (see FIG. 12(D)). Next, the scribing apparatus forms scribed grooves 102 between the electrode patterns 101 on the surface of the bar-shaped wafer 100a (see FIG. 12(E)). Finally, the cleaving prism 103 is pressed against the back face of the bar-shaped wafer 100a along the scribed groove 102 (see FIG. 12(F)). The pressing operation cleaves the bar-shaped wafer 100a to obtain a number of chips 100b, with the scribed groove 102 acting as the starting point of the cleavage (see FIG. 12(G)).

There are two commonly known methods for forming the foregoing scribed grooves: one method forms a linear groove by moving the cutting edge linearly, and the other method forms a boat-shaped groove by moving the cutting edge along an arc-shaped path. FIG. 13 is a diagram illustrating the method for forming a boat-shaped groove. The boat-shaped groove is formed by using a scribing apparatus provided with a cutting part 200 having a cutting edge 201. The cutting part 200 is moved such that the cutting edge 201 forms an arc-shaped path as shown by an arrow. In this case, cracks 114 are formed in a direction perpendicular to the groove.

However, the foregoing conventional groove-forming method has a drawback of a large amount of dimensional deviation between the scribed groove and the cleaved plane. FIG. 14 is a plan view showing a bar-shaped wafer which is cleaved after scribed grooves are formed by the conventional method. In obtaining chips from a wafer, it is desirable that the cleaving line be on the extended line of the scribed groove 102 as shown by a broken line 110, which is referred to as the intended cleaving line 110. With the conventional method, however, an actual cleaving line 111 does not coincide with the scribed groove 102 (the intended cleaving line 110) as shown in FIG. 14 in many instances. The amount of dimensional deviation 112 between the actual cleaving line 111 and the scribed groove 102 is no less than ±15 μm or so in the worst instance. As a result, the large deviation in the outside dimensions makes it difficult to produce chips with high yield ratio, and it is difficult to obtain chips having cleaved surfaces with high-quality mirror finish. When the amount of dimensional deviation in cleavage 112 is large, another problem is created. For example, when an LD chip 100b and an optical fiber 113 are placed as shown in FIGS. 15(A) and 15(13), if the end face 100c of the chip 100b is unproperly placed against the end face of the optical fiber 113 as shown in FIG. 15(B), the light-emerging position relative to the position of the chip deviates from the designed position, decreasing the efficiency of the optical coupling.

SUMMARY OF THE INVENTION

A principal object of the present invention is to offer a method for forming a scribed groove that can reduce the amount of dimensional deviation between the scribed groove and the cleaved plane and that can produce chips featuring the outside dimensions with higher precision and the cleaved surfaces with high-quality mirror finish. Another object is to offer a scribing apparatus most suitable for implementing the foregoing method.

According to the present invention, the foregoing object is attained by moving a cutting edge along a path having the shape of an inverted trapezoid.

More specifically, the present invention offers a method for forming a scribed groove at the surface portion of a wafer by using a cutting part having a cutting edge, in which method the cutting part is moved such that the cutting edge forms a path having the shape of an inverted trapezoid.

Generally, a wafer is formed of a compound material (crystalline material) that has a cleaving property, the remarkable tendency to split of a crystalline substance along definite crystalline planes. Conventionally, chips are separated from a wafer by exploiting this cleaving property (the principle of the scribing). More specifically, the cutting part of a scribing apparatus applies a load in a direction perpendicular to the surface of a wafer 100 to form vertical microcracks 114 as shown in FIG. 16 at the time of the scribed groove formation. According to the principle of the scribing, a load is further applied to the cracks 114 to cleave the wafer so that chips can be separated from the wafer, with the cracks 114 acting as the starting point of cleavage.

Conventionally, the foregoing scribed groove is formed by two types of methods: one method forms a linear groove by moving the cutting edge linearly, and the other method forms a boat-shaped groove by moving the cutting edge along an arc-shaped path. However, in the foregoing conventional method, an insufficiently small number of vertical cracks 114 are produced at the surface portion of the wafer 100 as shown in FIG. 13, and an excessively large number of horizontal cracks 115 are produced as shown in FIG. 17. Furthermore, in the conventional method, the scribing is performed with the cutting edge arranged in a direction nearly perpendicular to the surface of the wafer. As a result, the stress produced by the mechanical shock at the time of the scribing spreads in multiple horizontal directions at the surface portion of the wafer.

After an elaborate study, the present inventors found that when a multitude of horizontal cracks spread in multiple directions, a split propagates horizontally to cleave the wafer stepwise as shown in the broken circular line in FIG. 14. As a result, the actual cleaving line 111 deviates from the scribed groove 102, i.e., the intended cleaving line 110. Finally, the present inventors found that in order to reduce the amount of dimensional deviation between the scribed groove and the cleaved plane and to produce chips featuring the cleaved surfaces with high-quality mirror finish, it is necessary to form a scribed groove at the surface portion of a wafer such that a large number of vertical cracks are produced while the number of horizontal cracks is reduced, desirably to zero. Based on the findings, the present invention specifies to move the cutting edge along a path having the shape of an inverted trapezoid.

In the present invention, the cutting part is moved such that the cutting edge forms a path having the shape of an inverted trapezoid. This operation enables the reduction in the scribing angle of the cutting edge to an acute angle. Consequently, the stress produced by the mechanical shock at the time of the scribing can be dispersed both in the moving direction of the cutting edge and in a direction perpendicular to the surface of the wafer. In other words, the present invention can reduce the stress in horizontal directions over the conventional method, thereby reducing the generation of the horizontal cracks. In addition, the present invention moves the scribing cutting edge horizontally along the bottom side of the inverted trapezoid in the wafer. This movement enables the cutting edge to apply a sufficient load in a direction perpendicular to the scribing plane in the wafer. As a result, a sufficient number of vertical cracks can be generated.

According to the present invention, the other object of offering a scribing apparatus most suitable for implementing the above-described method for forming a scribed groove is attained by offering the following scribing apparatus. The scribing apparatus comprises:

(a) a cutting part that has a cutting edge and that forms a scribed groove at the surface portion of a wafer;

(b) a horizontally moving portion that moves the cutting part horizontally to form the scribed groove;

(c) a vertically moving portion that moves the cutting part vertically to form the scribed groove; and (d) a controlling section that:
  (d1) expresses the location of the cutting edge as the horizontal coordinate and the vertical coordinate; and
  (d2) based on the coordinate data, operates the horizontally moving portion and the vertically moving portion.

To move the cutting edge along a path having the shape of an inverted trapezoid, it is possible to conceive a structure in which the location of the cutting edge is expressed as the coordinates, and the cutting edge is moved based on the coordinate data. In the present invention, the scribing apparatus is provided with a controlling section for the horizontal and vertical movements of the cutting part. The controlling section automatically operates the cutting part according to the predetermined coordinates. It is possible to design a structure in which the horizontal and vertical movements can be performed independently. The coordinates to be predetermined for the cutting edge may be an operation-starting position, an operation-ending position, an entry point at the surface of the wafer (the point at which the cutting edge becomes in contact with the wafer for the first time), and an exit point (the point at which the cutting edge terminates the contact with the wafer). Furthermore, to secure the predetermined depth and length of the scribed groove, the coordinates of the cutting edge for the deepest point at the entry side in the wafer and the deepest point at the exit side may be predetermined. The cutting edge can be moved along a path having the shape of an inverted trapezoid by predetermining the horizontal and vertical coordinates of the foregoing points to cause the cutting part to automatically move horizontally and vertically so that the cutting edge can satisfy the coordinates.

The present invention is further explained below.

Depending on the shape of the cutting part and the method of attaching the cutting part to the scribing apparatus, the cutting-edge angle (the angle between the cutting edge and the surface of the wafer) may not become an optimum angle after the cutting part is attached to the scribing apparatus. In order to secure the optimum angle, the method for forming a scribed groove of the present invention may further comprise the following steps:

(a) picking up the image of the cutting edge; and (b) based on the picked-up image data, adjusting the angle of the cutting edge against the surface of the wafer.

To perform the foregoing steps, a scribing apparatus may be provided with a function for adjusting the cutting-edge angle. Accordingly, the scribing apparatus of the present invention may further comprise the following portions:

(a) an image pickup portion that picks up the image of the cutting edge; and (b) a cutting-edge angle-adjusting portion that, based on the picked-up image data, adjusts the angle of the cutting edge against the surface of the wafer (cutting-edge angle).

Conventionally, the cutting-edge angle is adjusted by picking up the image of the attaching angle of the cutting part with a camera to adjust the attaching angle based on the picked-up image data. This cutting-edge angle-adjusting method using the attaching angle is dependent on the precision of the shape and dimensions of the cutting part in forming the scribed groove. However, the precision has insufficient limitations for forming the scribed groove. Consequently, it is difficult to form the scribed groove with high precision by the conventional method. To solve this problem, the present invention picks up the image of the cutting edge directly with the image pickup portion to detect the cutting-edge angle by using the picked-up image data. The fine adjustment of the cutting-edge angle itself, not the attaching angle, in accordance with the individual cutting parts enables the improvement of the precision of the scribed groove.

In addition, the conventional technique has difficulty in forming scribed grooves having a uniform thickness throughout the wafer. Conventionally, a fixed scribing depth of the cutting edge is specified to operate the cutting edge. However, the thickness of the wafer is not necessarily uniform throughout the wafer. When the thickness varies, the depth of the scribed groove varies, and the specified thickness may not be attained. In the place where the depth of the scribed groove does not satisfy the specified value, it is difficult to form a sufficient number of vertical cracks at the surface portion of the wafer. To solve this problem, the method for forming a scribed groove of the present invention may further comprise the following steps:

(a) measuring the thickness of the wafer; and (b) in accordance with the measured thickness, adjusting the entry position of the cutting part into the wafer by combining the horizontal and vertical movements of the cutting part.

In addition, the scribing apparatus of the present invention may further comprise a thickness-measuring portion that measures the thickness of the wafer. By employing the above-described structure, the present invention enables the attainment of a nearly uniform scribing depth throughout the wafer, thereby preventing the scribed groove from having a nonuniform depth.

The present invention provides auxiliary mechanisms such as the above-described cutting-edge angle-adjusting portion and thickness-measuring portion. As a result, an optimum scribed groove can be formed without being affected by the variations in the processing conditions, such as the material and shape of the cutting part and the thickness of the wafer.

As described above, it is desirable that the present invention be applied to the production of semiconductor chips from a wafer, such as the production of semiconductor laser diode chips (LD chips).

As explained above, the method for forming a scribed groove of the present invention moves the cutting edge along a path having the shape of an inverted trapezoid. This movement enables the generation of a large number of vertical cracks, thereby reducing the amount of dimensional deviation between the scribed groove and the cleaved plane. This excellent effect enables the production of the chips having the cleaved surfaces with high-quality mirror finish. The resultant highly precise outside dimensions enable an increase in the production yield. In the case of an LD chip, for example, the reduced dimensional deviation enables the proper placement of the end face of the chip against the end face of the optical fiber. This proper placement decreases the deviation in the light-emerging position relative to the position of the chip from the designed position, improving the efficiency of the optical coupling.

BRIEF DESCRIPTION OF THE DRAWING

FIGS. 12(A) to 12(G) are schematic diagrams illustrating the process for producing chips from a wafer.

FIGS. 15(A) and 15(B) are diagrams illustrating optical coupling conditions between an LD chip and an optical fiber when they are mounted on a device, wherein FIG. 15(A) shows a case when the amount of dimensional deviation in cleavage is small, and FIG. 15(B) shows a case when the amount of dimensional deviation in cleavage is large.

DETAILED DESCRIPTION OF THE INVENTION

Figure 1:
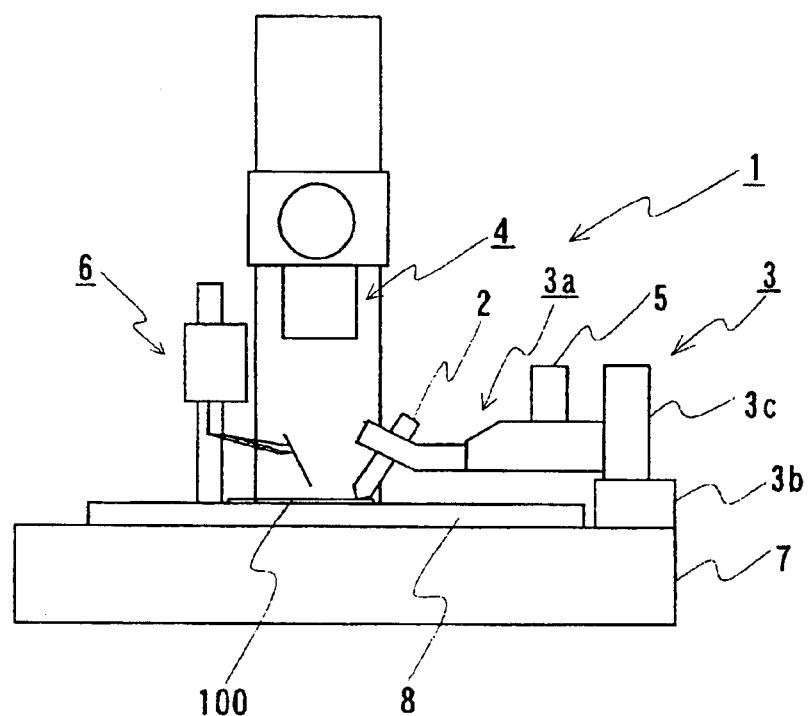
FIG. 1 is a schematic diagram showing the scribing apparatus of the present invention.

Embodiments of the present invention are explained below by referring to the accompanying drawings. In the drawings, the same number or sign refers to the same element or dimension to avoid duplicated explanation. The ratios of the dimensions in the drawings do not necessarily coincide with the explanation.

Figure 2:
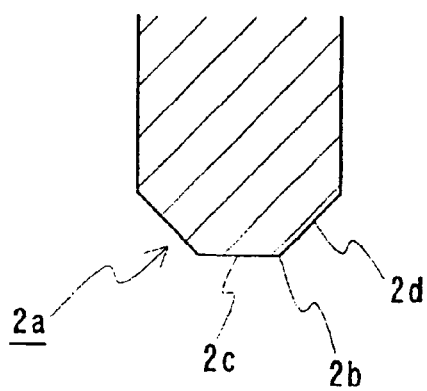
FIG. 2(A) is a vertical cross section of the cutting edge of a cutting part.
FIG. 2(B) is an enlarged diagram showing the tip portion of the cutting edge.
Figure 2:
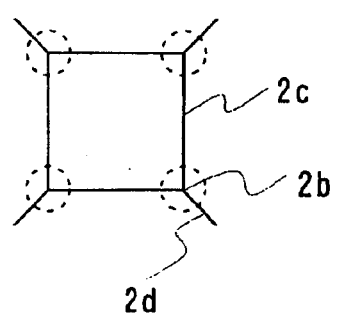
Figure 3:
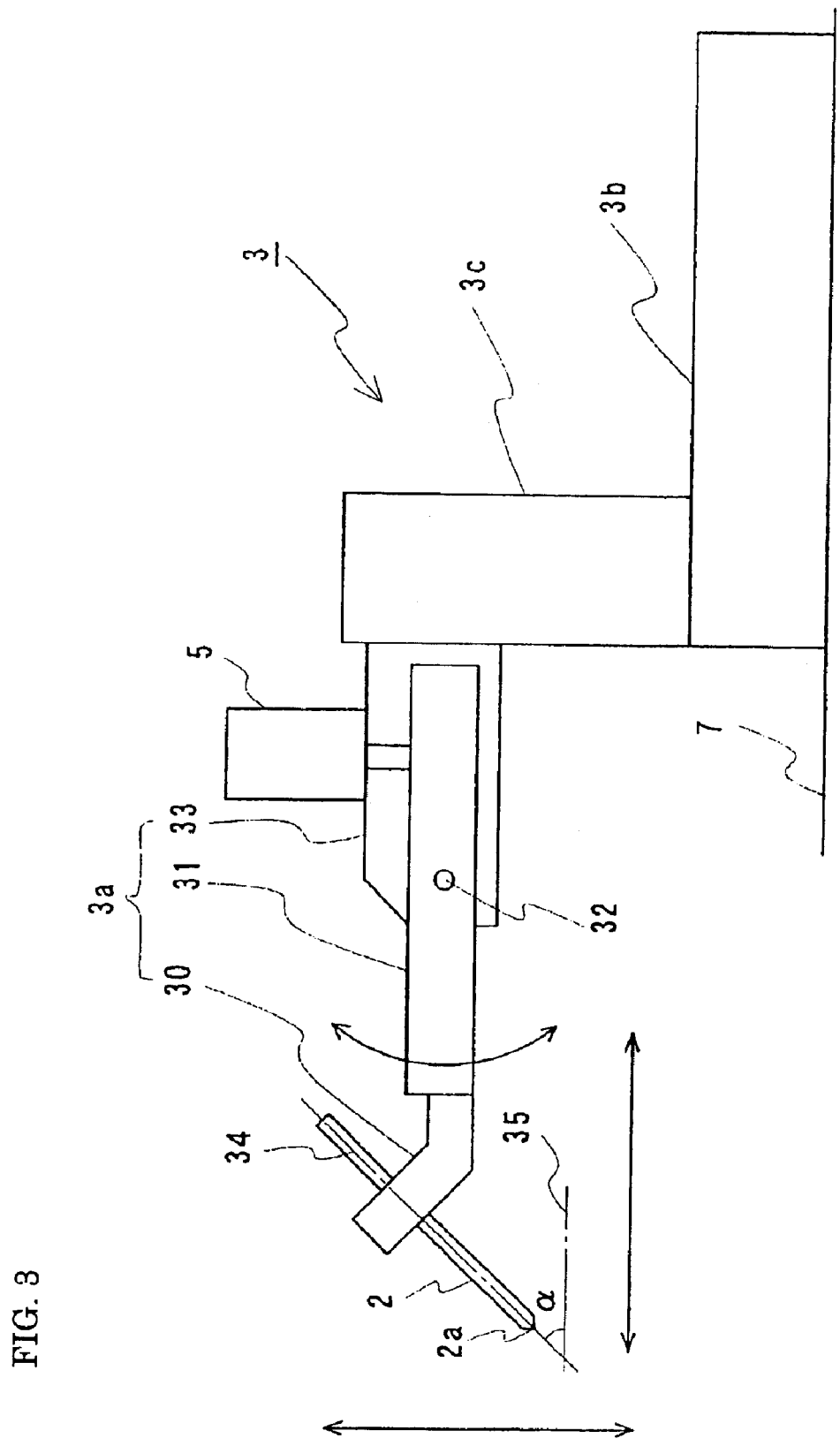
FIG. 3 is a schematic diagram showing a supporting-and-operating portion for the cutting part in the scribing apparatus of the present invention.
Figure 4:
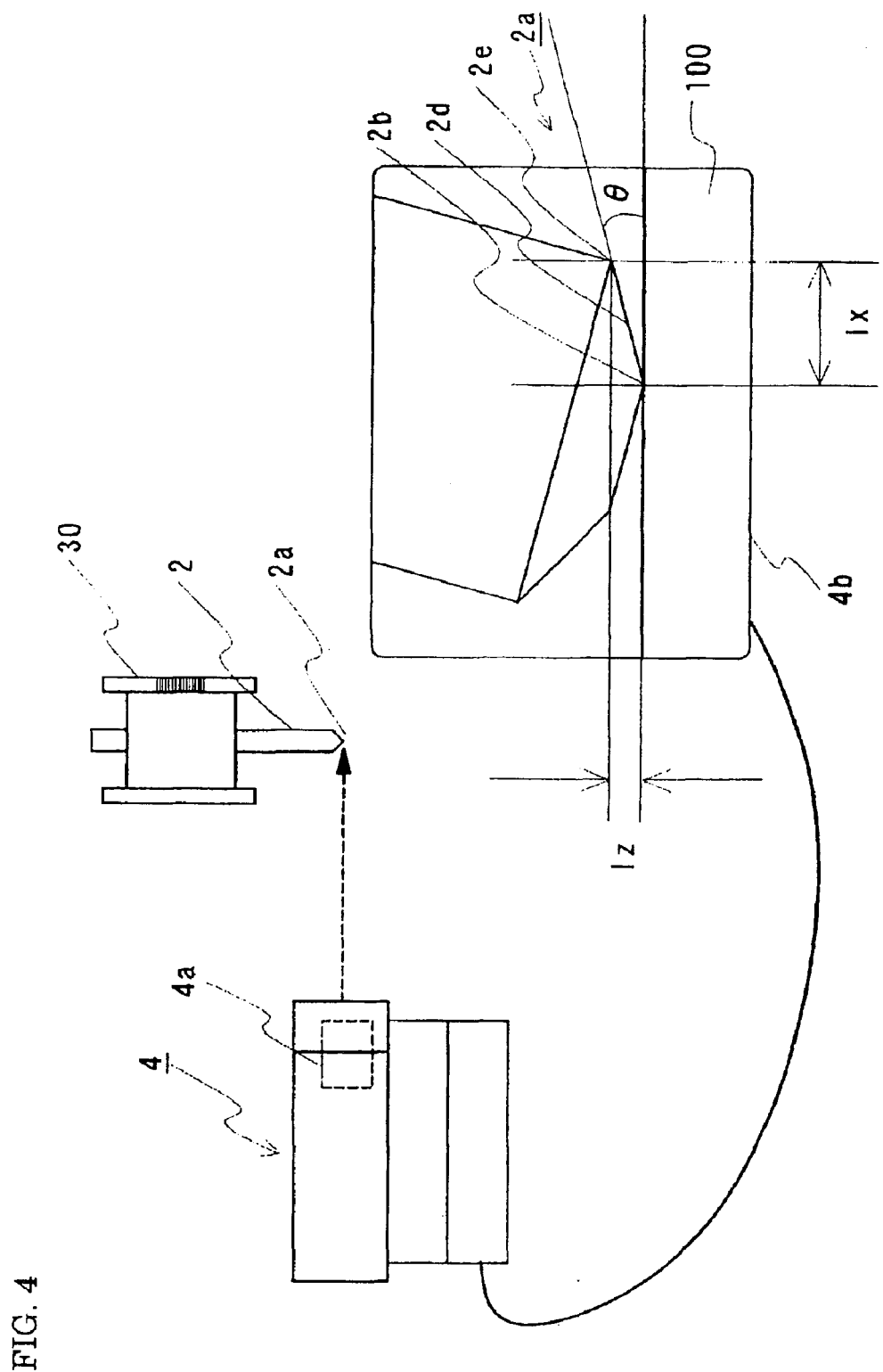
FIG. 4 is a diagram illustrating an image pickup portion in the scribing apparatus of the present invention.
Figure 5:
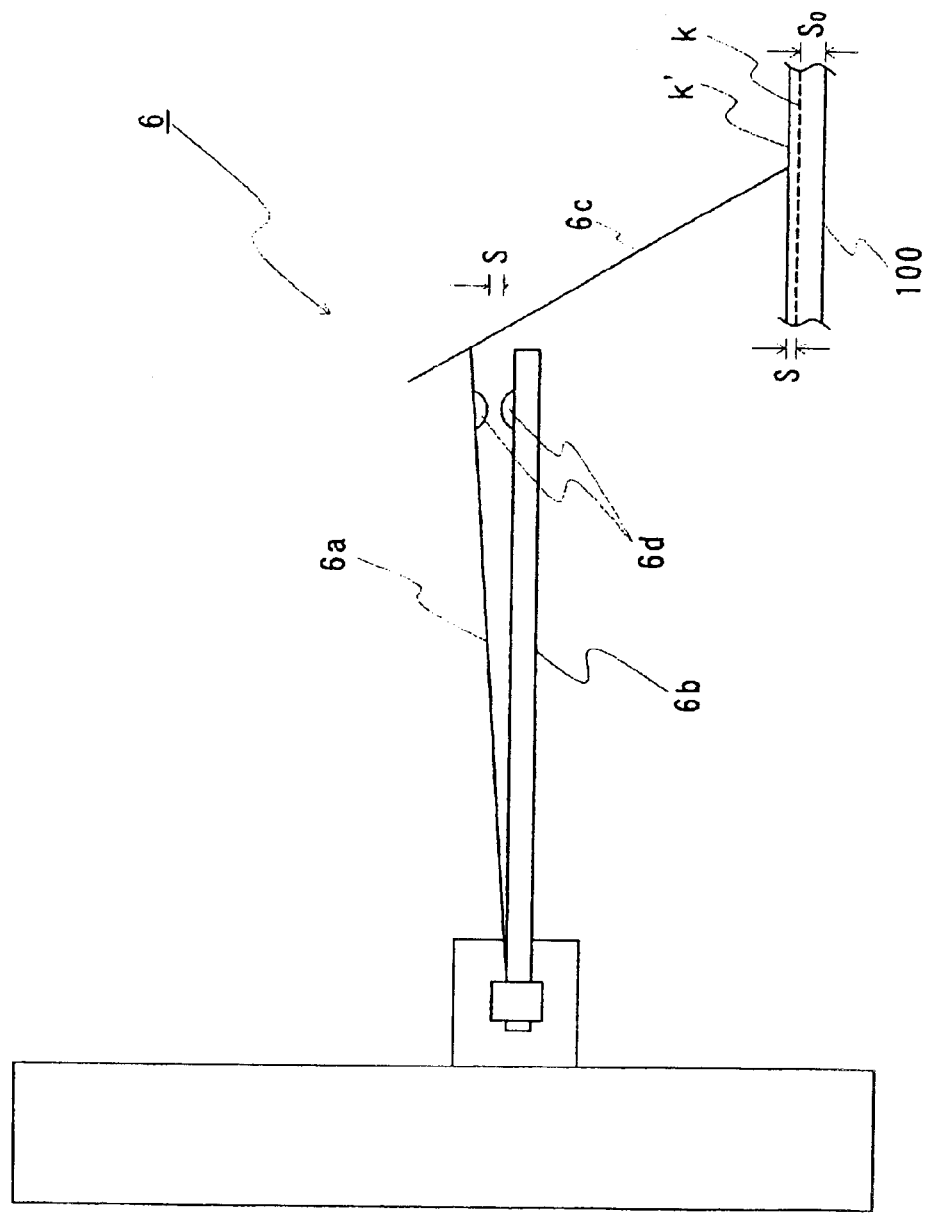
FIG. 5 is a schematic diagram showing a thickness-measuring portion in the scribing apparatus of the present invention.

FIG. 1 is a schematic diagram showing the scribing apparatus of the present invention. FIG. 2(A) is a vertical cross section of the cutting edge of a cutting part. FIG. 2(B) is an enlarged diagram showing the tip portion of the cutting edge. FIG. 3 is a schematic diagram showing a supporting-and-operating portion for the cutting part. FIG. 4 is a diagram illustrating an image pickup portion. FIG. 5 is a schematic diagram showing a thickness-measuring portion. A scribing apparatus 1 of the present invention comprises (a) a cutting part 2 that forms scribed grooves at the surface portion of a wafer 100, (b) a supporting-and-operating portion 3 that supports and moves the cutting part 2, (c) an image pickup portion 4 that picks up the image of a cutting edge 2a (see FIG. 2(A)) of the cutting part 2, (d) a cutting-edge angle-adjusting portion 5 that adjusts the angle of the cutting edge against the surface of the wafer 100 or the scribing plane in the wafer 100, (e) a thickness-measuring portion 6 that measures the thickness of the wafer 100, (f) a stage 7, and (g) a wafer stage 8. The apparatus is further explained below.

Cutting Part

The cutting part for forming scribed grooves can be any type providing that it can form a groove at the surface portion of a wafer. For example, a cutting part made of diamond can be used. The cutting edge of the cutting part may have the shape of a prismoid, for example. In this case, the groove-forming portion of the cutting edge can be selected according to the factors such as the material of the wafer. For example, the groove-forming portion can be a vertex of a prismoid, more specifically a vertex at which a corner of sides of the upper face meets an oblique edge. The angle produced by the upper face and the oblique edge has no special limitations. When the groove-forming vertex is in contact with the surface (horizontal plane) of the wafer, the oblique edge that includes the vertex and the surface of the wafer produces an angle. This angle is the scribing angle of the cutting edge against the wafer. This scribing angle is referred to as a cutting-edge angle throughout this document. The cutting-edge angle can be determined in accordance with the material of the wafer. For example, when the wafer is made of InP, it is desirable that the angle be 0.5 to 1 degree or so.

In this embodiment, for example, the cutting part 2 has a cutting edge 2a having the shape of a quadrangular prismoid, which has a trapezoidal cross section as shown in FIG. 2(A). The cutting edge 2a is made of diamond. The cutting part 2 has a total weight of about 10 grams. The groove-forming portion of the cutting part 2 scribes the wafer. In this example, a vertex 2b of the quadrangular prismoid is used as the groove-forming portion. As shown at the place surrounded by a broken circular line in FIG. 2(B), a vertex 2b is the intersection between a corner of sides 2c of the upper face of the quadrangular prismoid and an oblique edge 2d. The cutting part 2 is comparatively lightweight. However, the area of contact between the cutting edge 2a and the wafer is extremely small. As a result, the load applied to the wafer reaches a level of the order of tons per square millimeter.

Supporting-and-Operating Portion

As shown in FIG. 3, the supporting-and-operating portion 3 comprises (a) a supporting portion 3a that supports the cutting portion 2, (b) a horizontally moving portion 3b that moves the cutting part 2 horizontally, and (c) a vertically moving portion 3c that moves the cutting part 2 vertically. The supporting portion 3a is composed of (a) a holding portion 30 that holds the cutting part 2, (b) an pivoting portion 31 that is connected to the holding portion 30 and that can pivot about a fulcrum 32, and (c) an attaching portion 33 that supports the pivoting portion 31 and that is attached to the vertically moving portion 3c. In this example, the cutting part 2 is fixed to the holding portion 30 such that it can maintain a slanting position with a predetermined angle. More specifically, as shown in FIG. 3, an axis 34 of the cutting part 2 is inclined toward a horizontal line 35 with an angle, α, which is referred to as an attaching angle. In this example, the attaching angle α is 45 degrees. In this example, the pivoting portion 31 is provided to move the cutting part 2 such that it forms an arc-shaped path about the fulcrum 32. This is an ancillary operation for facilitating the engagement and disengagement between the cutting edge 2a and the wafer, rather than the principal operation of forming the scribed groove as in the above-described conventional method for forming a boat-shaped groove. In addition, the pivoting portion 31 is provided with a cutting-edge angle-adjusting portion 5, which is described below.

The horizontally moving portion 3b is placed on the stage 7 such that it can slide freely on the stage 7. The horizontal movement of the horizontally moving portion 3b moves the cutting portion 2 horizontally. The vertically moving portion 3c is attached to the horizontally moving portion 3b such that it can move in a direction perpendicular to the horizontally moving portion 3b. The forgoing supporting portion 3a for the cutting part 2 is fixed to one end of the vertically moving portion 3c. In this example, furthermore, the location of the cutting edge 2a of the cutting part 2 is expressed as the coordinates particularly to provide the coordinate data for operating the cutting edge 2a when the scribed grooves are formed. More specifically, the horizontal location is expressed as the x coordinate, and the vertical location is expressed as the z coordinate. The coordinate data of the present location of the cutting edge 2a and its new location to be shifted are fed into a controlling section (not shown), which in turn automatically moves the horizontally moving portion 3b and the vertically moving portion 3c. The automatic horizontal and vertical movement of the cutting part 2 at the time of the scribed-groove formation enables the reliable placement of the cutting part 2 at the predetermined entry position for the groove formation, without depending on the skill of the worker. Furthermore, the horizontally moving portion 3b and the vertically moving portion 3c are operated not only for the movement of the cutting part 2 at the time of the groove formation but also for the preliminary movement of the cutting part 2 to the vicinity of the wafer 100.

Cutting-Edge Angle-Adjusting Portion

It is desirable that the cutting-edge angle-adjusting portion be provided with a device such as an angle-adjusting micrometer capable of changing the angle by using the pitch of a thread, for example. The cutting-edge angle-adjusting portion can be operated either manually or automatically. A controller for the automatic operation can be designed such that it adjusts the cutting-edge angle to satisfy a properly determined threshold value in accordance with the present cutting-edge angle detected by using the picked-up image.

This example uses a manually operating angle-adjusting micrometer capable of changing the angle with a dial gauge. The angle-adjusting portion of this example has a structure that changes with an increment of 0.1 degrees the angle of the integrated body of the holding portion 30, the pivoting portion 31, and the cutting part 2 held by the holding portion 30.

Image Pickup Portion

It is desirable that the image pickup portion be provided with an image pickup device, such as a CCD camera, and a microscope. It is also desirable that the image pickup portion be provided with an image-treating section to treat picked-up images. In this case, it is desirable that the image pickup portion be provided with not only a controlling section for controlling the image pickup operation but also another controlling section for the image-treating section, which treats picked-up images consecutively to detect the coordinates of the location of the cutting edge based on the obtained image data. In addition, the latter controlling section can be designed to automatically calculate the cutting-edge angle based on the detected coordinates. Furthermore, when the image pickup portion is provided with a displaying device such as a monitor that displays the image picked up by the image pickup device, the conditions of the cutting edge, such as the amount of wear, chipping, and contamination, can be confirmed visually.

For example, as shown in FIG. 4, the image pickup portion 4 is provided with a CCD camera 4a, an image-treating section (not shown) for treating the image picked up by the camera 4a, and a monitor 4b that displays the image picked up by the camera 4a. In this example, the CCD camera 4a picks up the image of the cutting edge 2a of the cutting part 2, and the picked-up image data is used to express the location of the cutting edge 2a as the coordinates. The coordinate data is used to obtain the cutting-edge angle, θ. As shown in FIG. 4, the cutting-edge angle, θ, is the angle produced by the oblique edge 2d including the vertex 2b and the surface of the wafer 100 at the point where the cutting edge 2a is in contact with the wafer 100. The cutting-edge angle-adjusting portion 5 shown in FIG. 3 adjusts the cutting-edge angle, θ, so that it can satisfy the predetermined angle. The image-treating section supplies the coordinate data of the vertex 2b and the end point 2e. Then, the cutting-edge angle, θ, is calculated by using the following equation:

$$\tan \theta = 1z/1x,$$

where 1z: vertical distance between the end point 2e of the oblique edge 2d and the surface of the wafer 100

Figure 6:
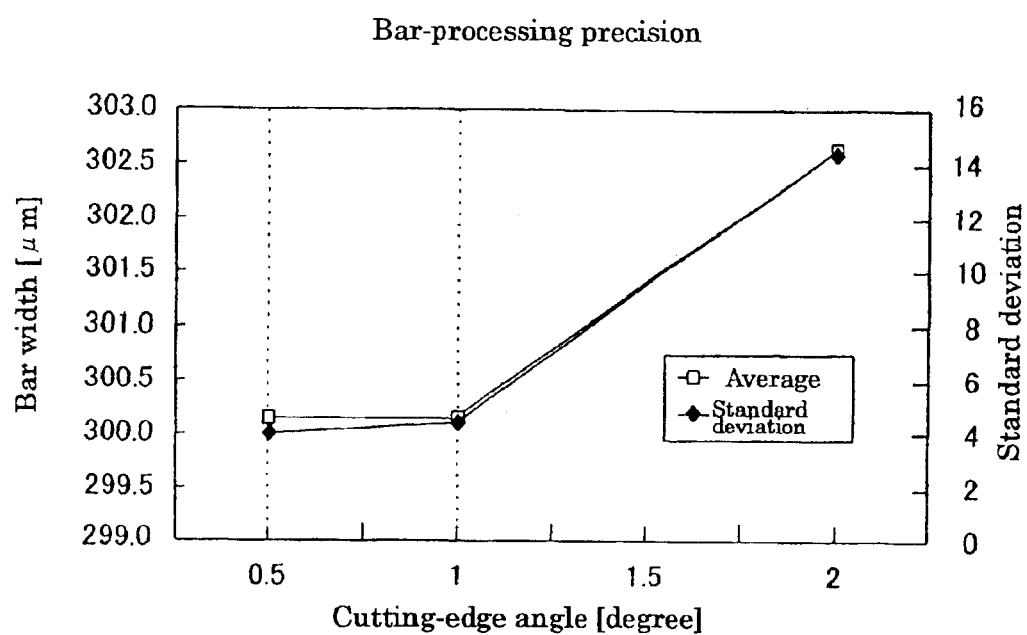
FIG. 6 is a graph showing the processing precision when a bar-shaped wafer is produced by using the scribing apparatus of the present invention.

1x: horizontal distance between the vertex 2b and the end point 2e. In this example, the cutting-edge angle, θ, is calculated by the worker. FIG. 6 is a graph showing the processing precision when bars are separated from a wafer. The data is obtained when a wafer made of InP is cleaved to obtain bars by changing the cutting-edge angle, θ, from 0.5 to 2 degrees at the time of the scribed-groove formation. As shown in FIG. 6, in the case of a wafer made of InP, when the cutting-edge angle falls in the range of 0.5 to 1 degree or so, the amount of dimensional deviation in cleavage is as small as less than 0.5 μm for the specified bar width of 300 μm. The variations in the bar width is also small. In view of this result, this example employs a cutting-edge angle, θ, of 0.5 to 1 degree.

Thickness-Measuring Portion

The thickness-measuring portion can be a contact or noncontact type. The contact type can be provided with (a) a movable piece and a fixed piece placed oppositely and (b) a contact piece whose one end is fixed to the free end of the movable piece and whose other end makes contact with the surface of a wafer. The noncontact type can be a measuring device that irradiates a laser beam on a wafer so that the beam can be focused on the surface of the wafer to measure the distance on the principle of a confocal point. An example of this measuring device is a laser focus displacement meter.

The alteration and adjustment of the entry position of the cutting part can be performed by moving the cutting part in accordance with the calculated amount of movement expressed as the x coordinate (horizontal direction) and the z coordinate (vertical direction). In this case, the thickness-measuring portion can be provided with a controlling section that automatically controls the horizontal and vertical movement of the cutting part based on the supplied coordinate data.

For example, FIG. 5 shows a thickness-measuring portion 6 incorporating a contact-type sensor. More specifically, the sensor is provided with (a) a movable piece 6a and a fixed piece 6b placed oppositely and (b) a contact piece 6c whose one end is fixed to the free end of the movable piece 6a and whose other end makes contact with the surface of a wafer 100. The movable piece 6a and the fixed piece 6b have a contact point 6d at their opposed face. When the contact piece 6c is in contact with the surface of a reference wafer 100 (reference surface k) and at the same time the contact points 6d are in contact with each other, this condition is referred to as a reference condition. With this reference condition established, when the contact piece 6c is in contact with a surface k' of an actual wafer 100, if the actual wafer 100 is thicker than the reference wafer, the contact piece 6c shifts upward from the reference surface k and at the same time the movable piece 6a is dissociated from the fixed piece 6b. This operation produces a gap between the contact points 6d. The magnitude S of the gap is measured by a measuring section (not shown). The thickness of the actual wafer is obtained by adding the magnitude S to the thickness $S_0$ of the reference wafer. This example sends the obtained thickness data to the controlling section.

Figure 7:
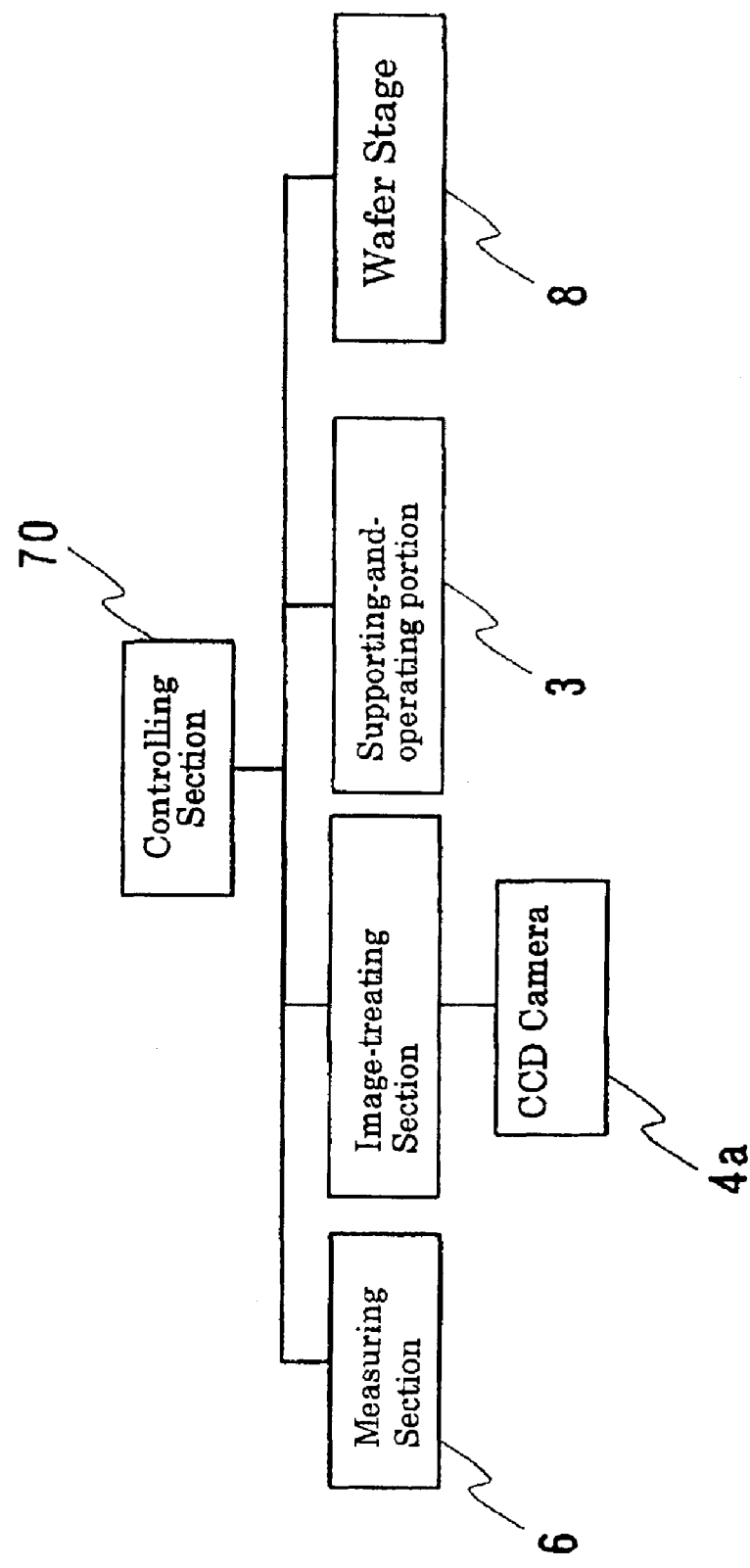
FIG. 7 is a block diagram showing the function of the scribing apparatus of the present invention.

This example has a structure as shown in FIG. 7, in which the following members are connected to a controlling section 70: the measuring section 6, the CCD camera 4a, the image-treating section to which the CCD camera 4a sends the image data, the supporting-and-operating portion 3, and the wafer stage 8. The controlling section 70 performs the following control tasks to form the scribed grooves effectively:

(a) to recognize the coordinates of the location of the cutting part 2;

(b) to move the cutting part 2 horizontally and vertically based on the predetermined coordinate data at the time of the scribed-groove formation and the preliminary movement;

(c) to control the CCD camera 4a;

(d) to treat the image picked up by the CCD camera 4a;

(e) to output the coordinates of the location of the cutting edge based on the image data;

(f) to output the thickness of the wafer;

(g) based on the thickness of the wafer, to predetermine the coordinates to which the supporting-and-operating portion is to be shifted; and (h) to move the supporting-and-operating portion.

Figure 8:
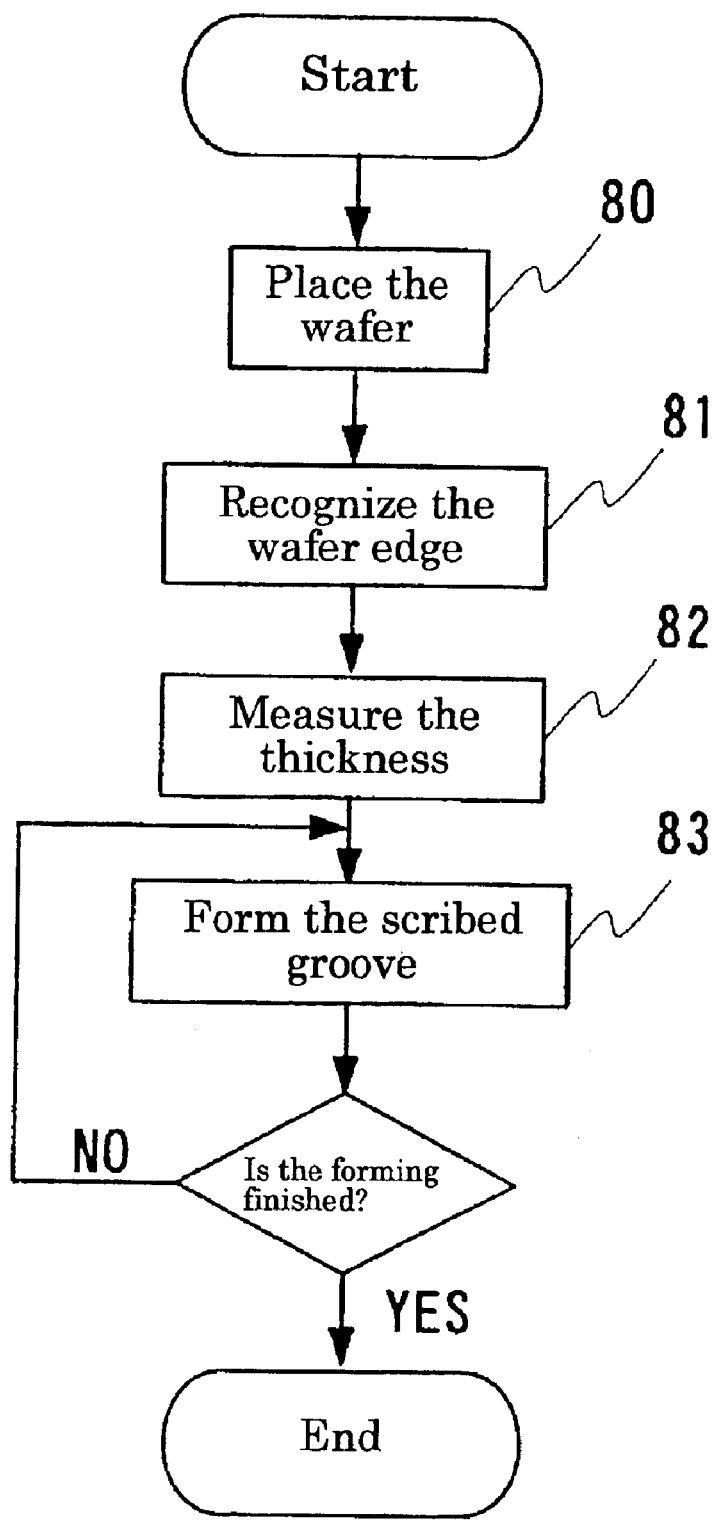
FIG. 8 is a flow chart showing the sequence of the method for forming a scribed groove according to the present invention.

The procedure for forming a scribed groove by using the scribing apparatus of the present invention is explained below by referring to FIG. 8, which is a flow chart showing the sequence. First, a wafer provided with electrode patterns is placed on the wafer stage 8 as shown in FIG. 1 (Step 80). The cutting part is attached to the supporting-and-operating portion with an attaching angle of α=45 degrees. The attaching work is performed such that there remains a predetermined distance between the cutting edge and the wafer to avoid the contact between the two members. The load to be applied by the cutting part is determined in advance to feed it into the controlling section.

The edge of the wafer is recognized by the controlling section (Step 81). The scribed groove is usually formed in the vicinity of the edge of the wafer. To locate the operation-starting position of the cutting part in the vicinity of the edge of the wafer, the information on the edge of the wafer is fed into the controlling section. In this example, the image pickup portion 4 picks up the image of the wafer to send it to the image-treating section. The image-treating section treats the image data, recognizes the edge of the wafer, and expresses the location of the edge of the wafer as the coordinates to send the coordinate data to the controlling section. The controlling section determines the coordinates of the operation-starting position 10 of the cutting part (see FIG. 10(A) described below) based on the coordinates of the edge of the wafer. Then, the supporting-and-operating portion moves the cutting part to the operation-starting position 10. The controlling section determines the coordinates of an entry point 11, an exit point 12, the deepest point 13 at the entry side, the deepest point 14 at the exit side, and the operation-ending position 15 (see FIG. 10(A) described below) so that a scribed groove having the specified depth d and length L can be obtained. The horizontal distance (distance in the x coordinate) between the entry point 11 and the exit point 12 is equal to the length L of the scribed groove. The vertical distance (distance in the z coordinate) between the entry point 11 and the deepest point 13 is equal to the depth d of the scribed groove (see FIG. 10(A) described below). These coordinates are predetermined for the scribed groove to be formed to memorize them in the controlling section.

Next, the thickness of the wafer is measured by the thickness-measuring portion (Step 82). The thickness can be measured over the entire surface of the wafer. However, in this example, only the thickness of the place between the electrode patterns where the scribed groove is to be formed is measured throughout the wafer. The thickness is measured based on the reference surface of the reference wafer used to adjust the contact-type sensor. In this case, the places between the electrode patterns where the scribed grooves are to be formed are expressed as the coordinates in advance. Then, the measured thicknesses are memorized in the controlling section in accordance with the corresponding coordinates for the groove-forming locations.

Figure 9:
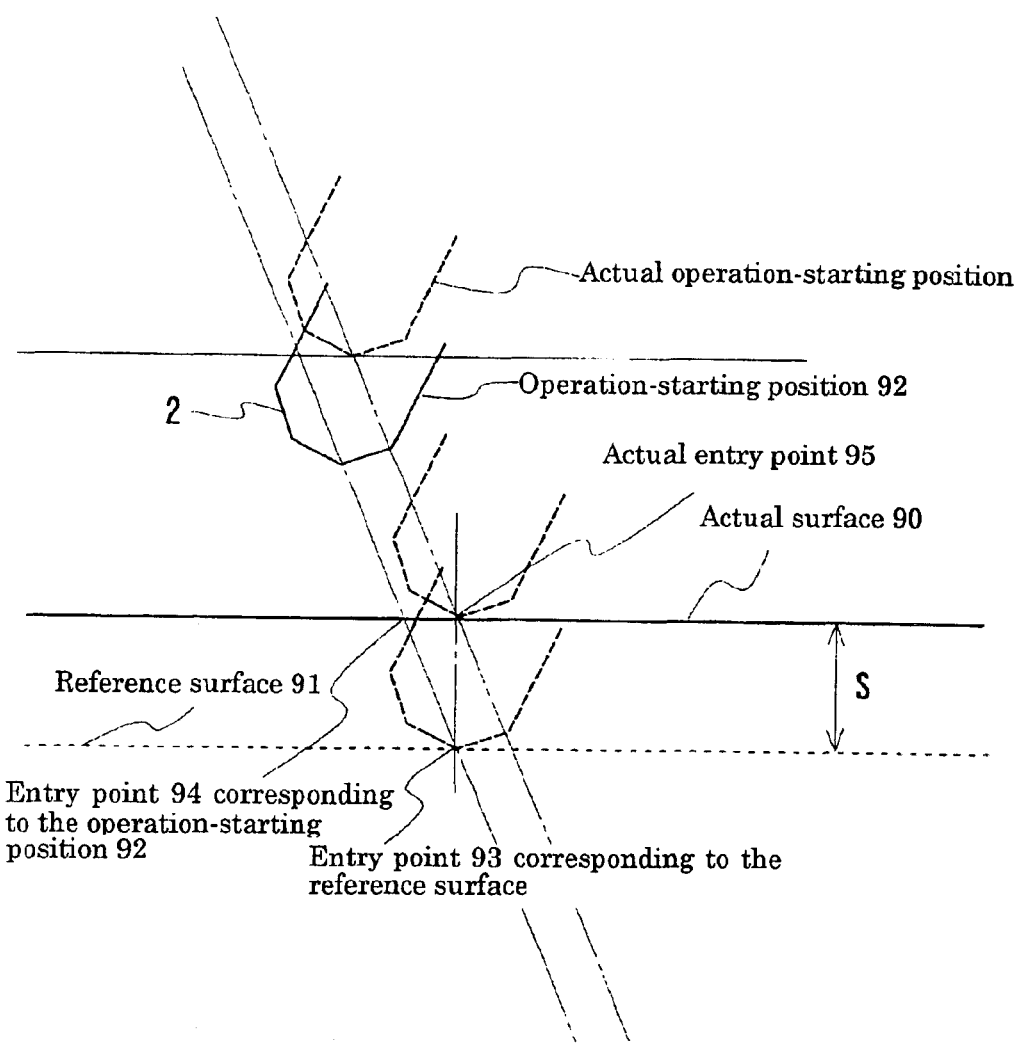
FIG. 9 is a diagram illustrating the entry point of the cutting part in the method for forming a scribed groove according to the present invention.

FIG. 9 is a diagram illustrating the entry point of the cutting part. For example, when the actual wafer to which scribed grooves are to be formed is thicker than the reference wafer, the surface 90 of the actual wafer is above the reference surface 91. Consequently, as shown in FIG. 9, if the cutting part 2 starts its operation at the operation-starting position 92 for the reference surface 91 to enter the actual surface 90 of the actual wafer, the entry point shifts to an entry point 94 from the entry point 93 for the reference surface 91 (the coordinates shift accordingly). As a result, the scribed groove having the specified depth cannot be formed. In order to avoid this deviation, the operation-starting position 92 is altered and readjusted to shift the cutting part 2 horizontally and vertically so that the actual entry point 95 can be located directly above the entry point 93 for the reference surface 91. More specifically, the x coordinate for the actual entry point 95 is equalized to that for the entry point 93 for the reference surface 91. Similarly, the z coordinate for the actual entry point 95 is obtained by adding the distance S between the actual surface 90 and the reference surface 91 to the z coordinate for the entry point 93. As explained above, the thickness of the wafer is first measured by the foregoing method. Then, the thickness data is used to alter the predetermined coordinates of the entry point, and the coordinates of the operation-starting position of the cutting part are altered and shifted to a new position accordingly. After these alterations, the coordinates for the exit point, the deepest point at the entry side, the deepest point at the exit side, and the operation-ending position are altered. This procedure is repeated to every scribed groove to be formed. The controlling section can perform this alteration work by referring to the memorized coordinate data of the place between the electrode patterns where the scribed groove is to be formed and to the memorized thickness data of the wafer at the place.

Figure 10:
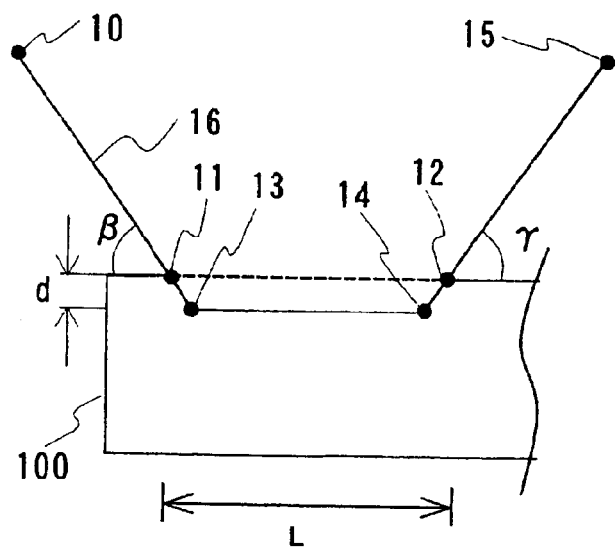
FIG. 10(A) is a schematic diagram showing the path of the cutting edge of the cutting part in the method for forming a scribed groove according to the present invention.
FIG. 10(B) is a schematic diagram illustrating the operation of the cutting edge.
Figure 10:
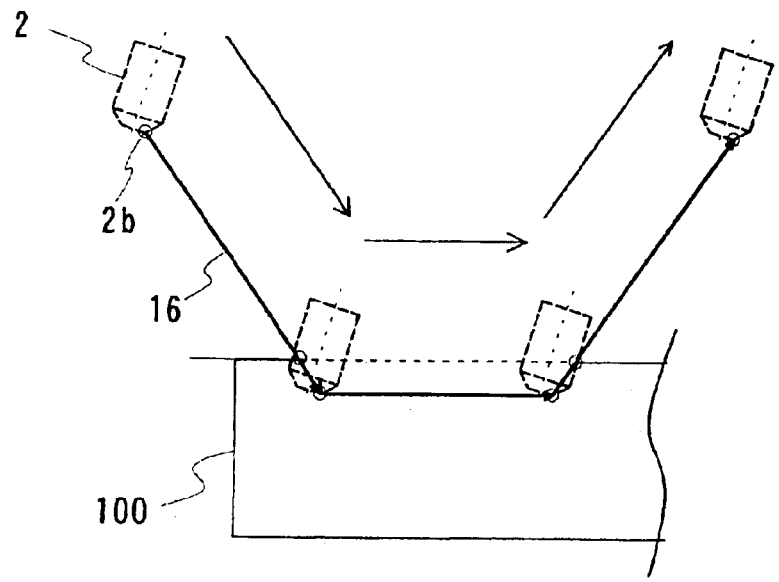

Subsequently, the horizontally moving portion and the vertically moving portion move the cutting part horizontally and vertically to form the scribed groove (Step 83). FIG. 10(A) is a schematic diagram showing the path of the cutting edge of the cutting part, and FIG. 10(B) is a schematic diagram illustrating the operation of the cutting edge. Based on the predetermined coordinates of the entry point 11, the deepest point 13 at the entry side, the deepest point 14 at the exit side, the exit point 12, and the operation-ending position 15, the supporting-and-operating portion moves the cutting part 2 as shown by an arrow in FIG. 10(B). In this movement, the vertex 2b of the cutting edge 2a forms a path 16, which has the shape of an inverted trapezoid. The foregoing movement of the cutting part forms a scribed groove that is accompanied by a small number of horizontal cracks and a large number of vertical cracks. In the path 16 formed by the movement of the cutting edge 2a against the wafer 100, an entry angle $\beta$ of the cutting part can be obtained by using the coordinates of the operation-starting position 10 and the entry point 11. Similarly, an exit angle $\gamma$ of the cutting part can be obtained by using the coordinates of the exit point 12 and the operation-ending position 15.

The formation work of the scribed groove is continued successively until the required number of scribed grooves are formed. More specifically, after finishing the formation of a scribed groove, the controlling section retrieves the memorized coordinate data for the next scribed groove.

Figure 11:
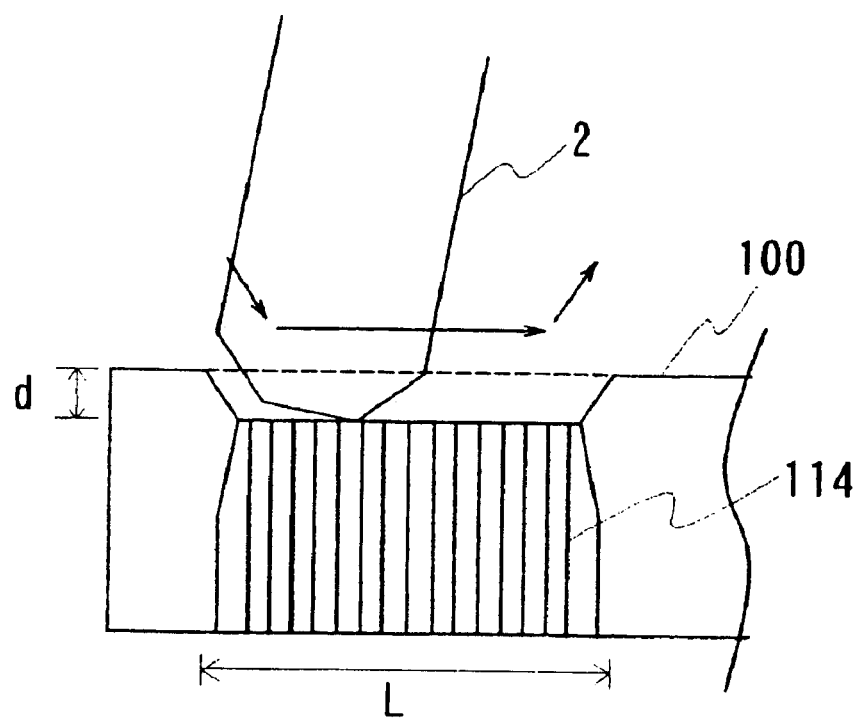
FIG. 11 is a diagram illustrating the state of the vertical cracks accompanying the scribed groove formed by the scribing apparatus of the present invention.
Figure 13:
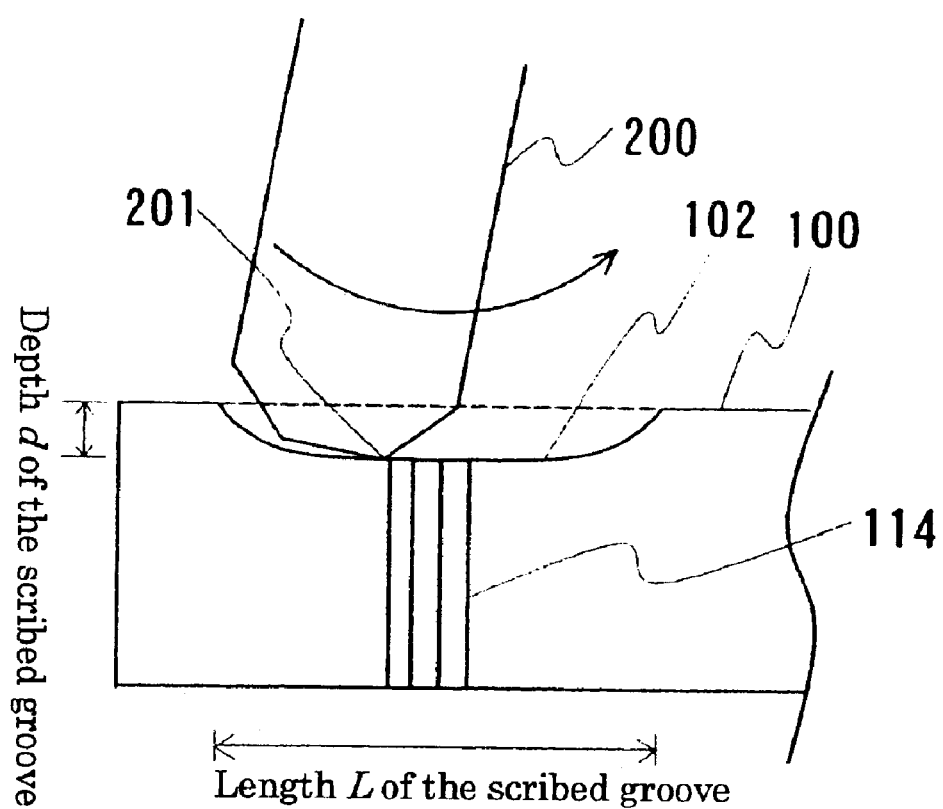
FIG. 13 is a diagram illustrating a conventional method for forming a boat-shaped scribed groove.
Figure 14:
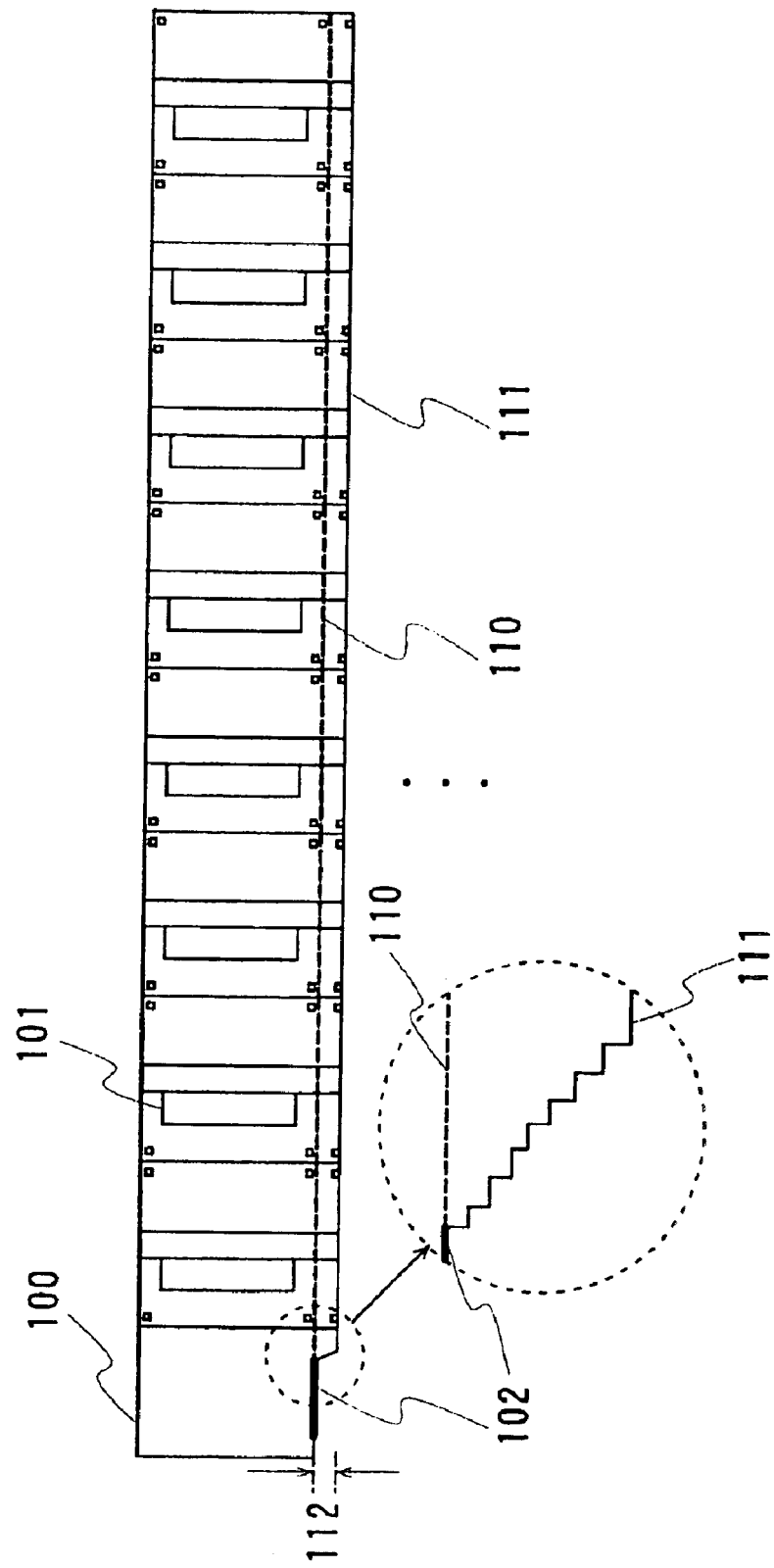
FIG. 14 is a plan view showing a bar-shaped wafer that is cleaved after scribed grooves are formed by the conventional method.
Figure 15:
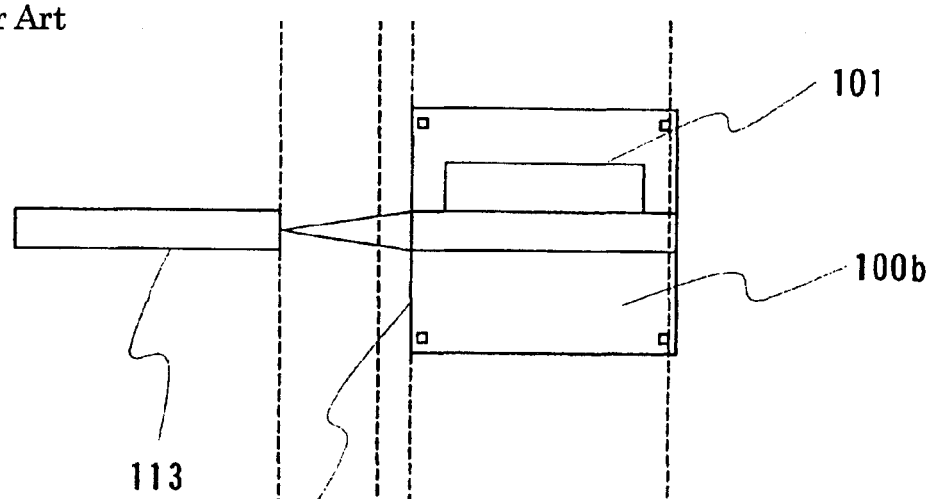
Figure 15:
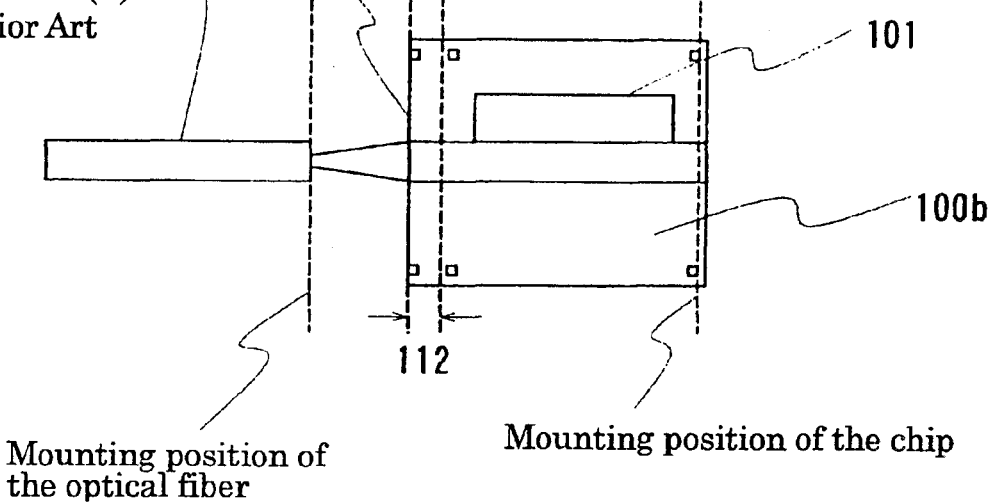
Figure 16:
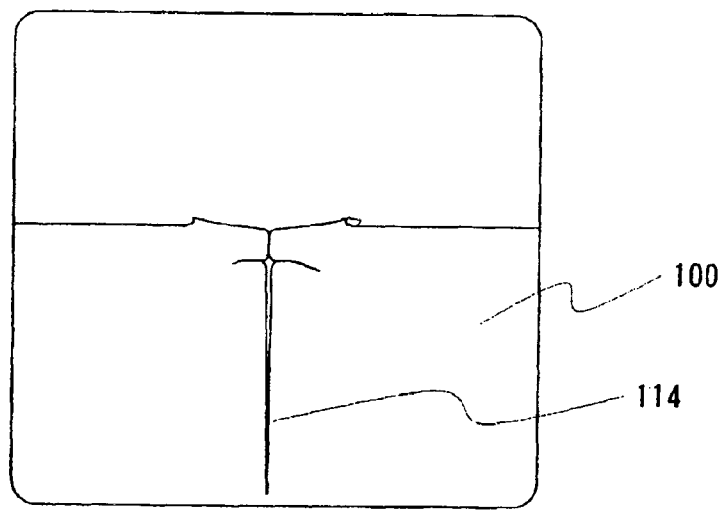
FIG. 16 is a schematic diagram showing a state when vertical cracks are generated at the surface portion of a wafer.
Figure 17:
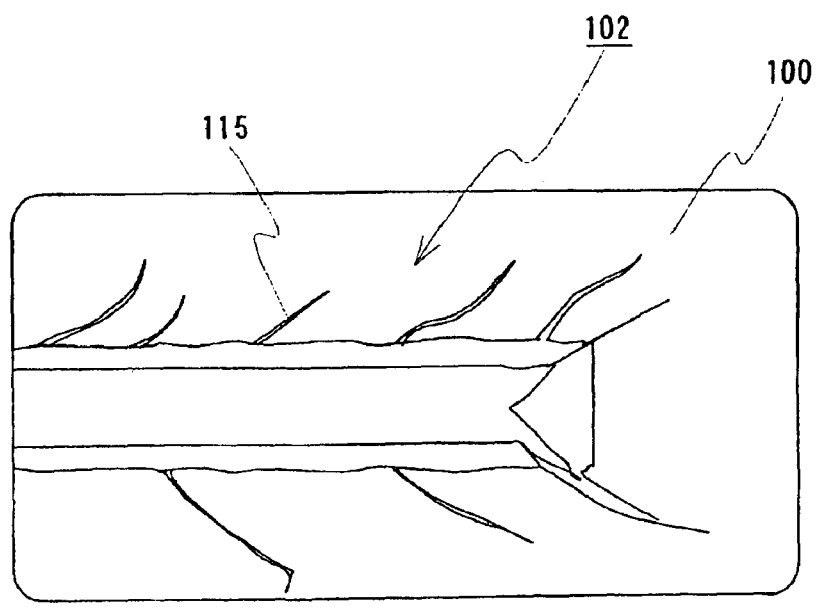
FIG. 17 is an enlarged schematic diagram showing a scribed groove formed by the conventional method.

FIG. 11 is a diagram illustrating the state of the vertical cracks accompanying the scribed groove formed by the scribing apparatus of the present invention. The present inventors formed a scribed groove on a wafer 100 made of InP by using the scribing apparatus of the present invention. The present inventors found that as shown in FIG. 11, vertical cracks 114 were formed densely over the nearly entire length L of the scribed groove. The amount of dimensional deviation in cleavage between the scribed groove and the cleaved plane was at most ±3 $\mu$m, which is remarkably smaller than the conventional deviation of ±15 $\mu$m or so. The decrease in the amount of dimensional deviation in cleavage enabled a yield rayio increase of about 7% over the conventional method. Furthermore, in the case of an LD chip, this decrease to at most ±3 $\mu$m enables an efficiency increase in the optical coupling with an optical fiber (see FIG. 15(A)).

What is claimed is:

1. A method for forming a scribed groove at the surface portion of a wafer by using a cutting part having a cutting edge, the method comprising the step of moving the cutting part such that the cutting edge forms a path having the shape of an inverted trapezoid.

2. A method as defined by claim 1, the method further comprising the steps of:

(a) picking up the image of the cutting edge; and
   (b) based on the picked-up image data, adjusting the angle of the cutting edge against the surface of the wafer.

3. A method as defined by claim 1, the method further comprising the steps of:

(a) measuring the thickness of the wafer; and
   (b) in accordance with the measured thickness, adjusting the entry position of the cutting part into the wafer by combining the horizontal and vertical movements of the cutting part.

4. A method as defined by claim 2, the method further comprising the steps of:

(a) measuring the thickness of the wafer; and
   (b) in accordance with the measured thickness, adjusting the entry position of the cutting part into the wafer by combining the horizontal and vertical movements of the cutting part.

* * * * *